(12) United States Patent
Moore (10) Patent No.: US 12,055,435 B2
(45) Date of Patent: *Aug. 6, 2024

(54) LINEAR REGULATION OF SPAD SHUTOFF VOLTAGE

(71) Applicant: STMicroelectronics (Research & Development) Limited, Marlow (GB)

(72) Inventor: John Kevin Moore, Edinburgh (GB)

(73) Assignee: STMicroelectronics (Research & Development) Limited, Marlow (GB)

(*) Notice: Subject to any disclaimer, the term of this patent is extended or adjusted under 35 U.S.C. 154(b) by 0 days.

This patent is subject to a terminal disclaimer.

(21) Appl. No.: 17/987,419

(22) Filed: Nov. 15, 2022

(65) Prior Publication Data

US 2023/0070070 A1 Mar. 9, 2023

Related U.S. Application Data

(63) Continuation of application No. 17/370,230, filed on Jul. 8, 2021, now Pat. No. 11,530,947.

(51) Int. Cl.
*G01J 1/44* (2006.01)
(52) U.S. Cl.
CPC ........... *G01J 1/44* (2013.01); *G01J 2001/442* (2013.01); *G01J 2001/4466* (2013.01)
(58) Field of Classification Search
CPC ................. G01J 1/44; G01J 2001/442; G01J 2001/4466; G01J 1/46; H01L 27/1443;
(Continued)

(56) References Cited

U.S. PATENT DOCUMENTS 4,626,676 A * 12/1986 Gerardin ............... G01S 7/4913
250/214 RC
6,259,612 B1  7/2001 Itoh
(Continued)

FOREIGN PATENT DOCUMENTS

CN      107063452 B    7/2018
EP        3477707 A1    5/2019

OTHER PUBLICATIONS

Yu Yue et al.: "A Review of Quenching Circuit Design Based on Geiger-Mode APD", 2018 IEEE International Conference On Mechatronics and Automation (ICMA), IEEE, Aug. 5, 2018 (Aug. 5, 2018), pp. 28-33, XP033416009.

(Continued)

*Primary Examiner* — Thanh Luu
*Assistant Examiner* — Monica T Taba
(74) *Attorney, Agent, or Firm* — Crowe & Dunlevy LLC (57) ABSTRACT

A sensing pixel includes a single photon avalanche diode (SPAD) coupled between a first node and a second node, with a clamp diode being coupled between a turn-off voltage node and the second node. A turn-off circuit includes a sense circuit configured to generate a feedback voltage based upon a voltage at the turn-off voltage node, a transistor having a first conduction terminal coupled to the turn-off voltage node, a second conduction terminal coupled to ground, and a control terminal, and an amplifier having a first input coupled to a reference voltage, a second input coupled to receive the feedback voltage, and an output coupled to the control terminal of the transistor. A readout circuit is coupled to the SPAD by a decoupling capacitor.

19 Claims, 4 Drawing Sheets

(58) Field of Classification Search
CPC .......... H01L 31/02027; H04B 10/6911; G01S 7/4861; G01S 7/4865; G01S 7/4913; G01S 7/4915; G01S 17/08; H03K 17/6871
See application file for complete search history.

(56) References Cited

U.S. PATENT DOCUMENTS

| | | |
|---|---|---|
| 2004/0245436 A1 | 12/2004 | Matsumoto |
| 2010/0014875 A1 | 1/2010 | Uto |
| 2010/0200781 A1 | 8/2010 | Khorasani et al. |
| 2012/0075615 A1* | 3/2012 | Niclass .................. G01S 7/489 356/5.01 |
| 2016/0223397 A1 | 8/2016 | Tsai et al. |
| 2018/0017632 A1 | 1/2018 | Moore |
| 2019/0123215 A1 | 4/2019 | Stark |
| 2020/0252564 A1 | 8/2020 | Palubiak |
| 2020/0319355 A1 | 10/2020 | Aull et al. |
| 2021/0193859 A1 | 6/2021 | Al-Rawhani et al. |

OTHER PUBLICATIONS

EPO Search Report and Written Opinion for counterpart EP Appl. No. 22180885.0, report dated Nov. 28, 2022, 9 pgs.

* cited by examiner

LINEAR REGULATION OF SPAD SHUTOFF VOLTAGE

RELATED APPLICATION

This is a continuation of U.S. Applications for Patent Ser. No. 17/370,230, filed Jul. 8, 2021, the contents of which are incorporated by reference herein in their entirety to the maximum extent allowable under the law.

TECHNICAL FIELD

This disclosure is directed to a circuit for linearly regulating a shutoff voltage for a single photon avalanche diode (SPAD).

BACKGROUND

Single photon avalanche diode (SPAD) photodetectors are based on a PN junction that is reverse biased at a voltage exceeding a breakdown voltage. When a photon-generated carrier (via the internal photoelectric effect) is injected into the depletion region of the PN junction, a self-sustaining avalanche ensues, and detection of current output as a result of this avalanche can be used to indicate detection of the photon that generated the carrier.

Figure 1:
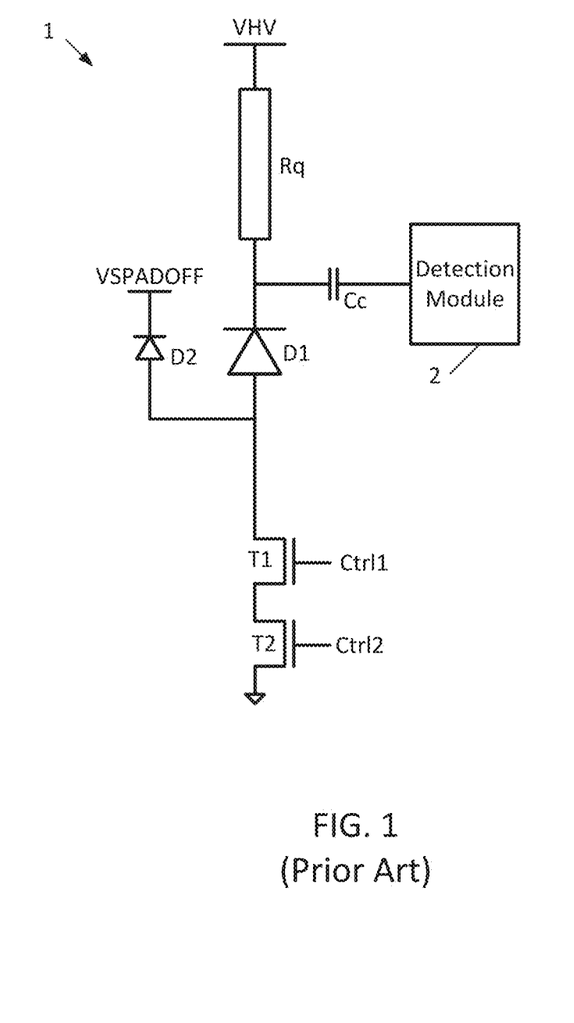
FIG. 1 is a schematic block diagram of a single photon avalanche diode (SPAD) pixel according to the prior art.

An example prior art SPAD pixel 1 is shown in FIG. 1. The pixel 11 includes a SPAD D1 having its cathode coupled to a high voltage supply VHV through a quench resistance Rq and its anode coupled to the drain of an n-channel transistor T1. Transistor T1 in turn has its source coupled to the drain of an n-channel transistor T2, which has its source coupled to ground. Transistor T1 is biased by a first control signal Ctrl1, which has a fixed voltage, while transistor T2 is biased by switching control signal Ctrl2. A clamp diode D2 has its anode coupled to the anode of the SPAD D1 and its cathode coupled to an off voltage for the SPAD D1, labeled as VSPADOFF.

When control signal Ctrl2 goes high, it turns on, connecting the anode of the SPAD D1 to ground, setting the reverse bias voltage of the SPAD D1 above the breakdown voltage, while the clamp diode D2 disconnects the anode of the SPAD D1 from the VSPADOFF voltage. When an incoming photon strikes the SPAD D1, its cathode voltage will swing between the high voltage and a lower voltage, creating a current pulse that is detected by the detection module 2. The avalanche is quenched by the quench resistance Rq, resetting the SPAD D1 for the next detection. The purpose for control signal Ctrl1 being a fixed voltage is to bias the transistor T1 so that it limits the current inrush to transistor T2 during the avalanche, protecting T2 from damage.

There are multiple different types of SPADs that may be used in such pixels. For some SPAD types, such as fully depleted SPADs, difficulties are encountered when it is desired to keep the SPAD off (e.g., where the control signal Ctrl2 is set such that the transistor T2 is off), because to keep the SPAD off, the anode voltage is to be kept around 5 to 7 volts. This is sufficiently high that it would damage the transistors T1 and T2.

As such, further development is needed into techniques for keeping such the SPAD of a pixel turned off when desired.

SUMMARY

A sensing pixel disclosed herein includes: a single photon avalanche diode (SPAD) coupled between a first node and a second node; a clamp diode coupled between a turn-off voltage node and the second node; and a turn-off circuit.

The turn-off circuit includes: a sense circuit configured to generate a feedback voltage based upon a voltage at the turn-off voltage node; a transistor having a first conduction terminal coupled to the turn-off voltage node, a second conduction terminal coupled to ground, and a control terminal; and an amplifier having a first input coupled to a reference voltage, a second input coupled to receive the feedback voltage, and an output coupled to the control terminal of the transistor. A readout circuit is coupled to the SPAD by a decoupling capacitor.

The SPAD may have a cathode coupled to the first node and an anode coupled to the second node; wherein the clamp diode has a cathode coupled to the turn-off voltage node and an anode coupled to the second node, and the readout circuit may be coupled to the SPAD at the first node by the decoupling capacitor.

A quench element may be coupled between a high voltage node and the first node, and an enable circuit may be coupled between the second node and ground.

The enable circuit may include: a cascode transistor having a drain coupled to the second node, a gate coupled to a cascode control voltage, and a source; and an enable transistor having a drain coupled to the source of the cascode transistor, a source coupled to ground, and a gate coupled to an enable voltage.

The first conduction terminal of the transistor may be a drain, the second conduction terminal of the transistor may be a source, and the control terminal of the transistor may be a gate. The first input of the amplifier may be a non-inverting input, and the second input of the amplifier may be an inverting input.

The turn-off circuit may also include a resistive divider coupled between the turn-off voltage node and ground, with the feedback voltage being generated at a tap node of the resistive divider.

The SPAD may be a fully depleted SPAD formed using a three dimensional layout.

The readout circuit may include: a first p-channel transistor having a source coupled to a supply voltage, a drain coupled to the decoupling capacitor, and a gate coupled to a bias voltage; a second p-channel transistor having a source coupled to the supply voltage, a drain coupled to an output node, and a gate coupled to the drain of the first p-channel transistor; and a first n-channel transistor having a drain coupled to the output node, a source coupled to ground, and a gate coupled to the gate of the second p-channel transistor.

Also disclosed herein is a sensing pixel, including: a single photon avalanche diode (SPAD) having a cathode coupled to a high voltage node through a quench element, and an anode selectively coupled to ground; and a clamp diode having an anode coupled to the anode of the SPAD and a cathode coupled to a turn-off voltage node. A turn-off circuit includes: an additional diode having an anode coupled to a supply voltage and a cathode coupled to the turn-off voltage node; a sense circuit configured to generate a feedback voltage based upon a voltage at the turn-off voltage node; an n-channel transistor having a drain coupled to the turn-off voltage node, a source coupled to ground, and a gate; and an amplifier having an inverting input coupled to a reference voltage and a non-inverting input coupled to receive the feedback voltage, the amplifier having an output coupled to the gate of the n-channel transistor.

When the SPAD has its anode disconnected from ground and is exposed to light, the SPAD may generate a photocurrent that flows from the anode of the SPAD, through the clamp diode to the turn-off voltage node, and through the sense circuit. In addition, the output of the amplifier may adjust conductivity of the n-channel transistor to cause the n-channel transistor to sink current from the turn-off voltage node, with an amount of current sunk by the n-channel transistor from the turn-off voltage node being proportional to an amount of photocurrent flowing through the sense circuit.

The sense circuit may be a resistive divider coupled between the turn-off voltage node and ground, with the feedback voltage being generated at a tap node of the resistive divider. The resistive divider may be: a first resistor connected between the turn-off voltage node and the tap node; and a second resistor connected between the tap node and ground.

The SPAD may be a fully depleted SPAD formed using a three dimensional layout.

A readout circuit may be coupled to the cathode of the SPAD, the readout circuit including an inverter generating an output signal based upon a voltage at the cathode of the SPAD.

Also disclosed herein is a method including: causing a single photon avalanche diode (SPAD) to generate a photocurrent while not avalanching; and sinking sufficient current from the SPAD to maintain the SPAD in a non-avalanchable condition regardless of a value of the photocurrent.

Sufficient current may be sunk from the SPAD to maintain the SPAD in the non-avalanchable condition by: permitting the photocurrent to flow through a sense circuit coupled to the SPAD; sinking a constant current from the sense circuit; adjusting the constant current so that a turn-off voltage generated at the SPAD remains substantially constant regardless of the value of the photocurrent, with the turn-off voltage being sufficient to maintain the SPAD in the non-avalanchable condition.

The photocurrent may be permitted to flow from the anode of the SPAD through the sense circuit to ground.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2:
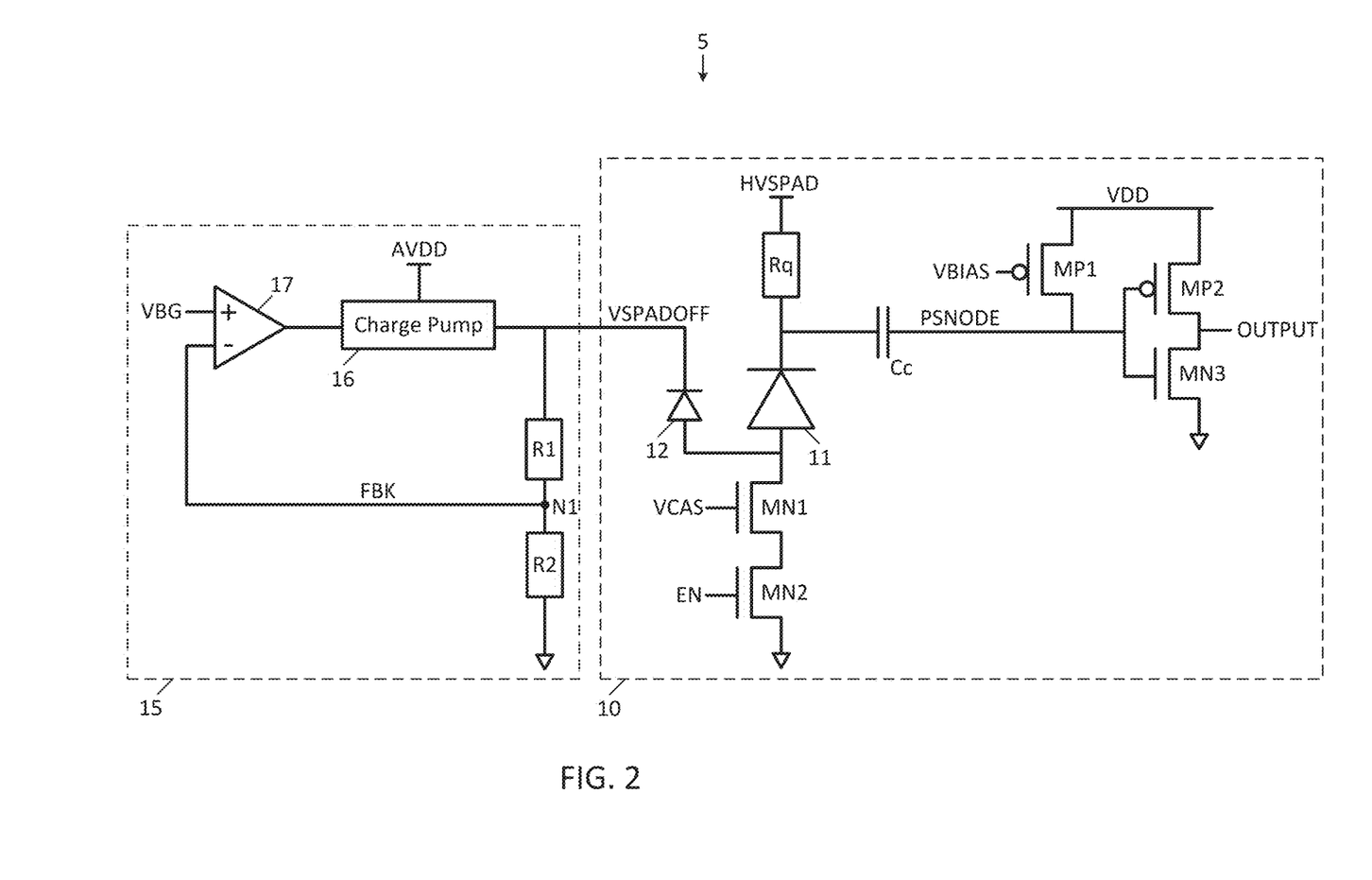
FIG. 2 is a schematic diagram of a first electronic device including a SPAD pixel and a turn-off circuit, as disclosed herein.

Now described with reference to FIG. 2 is a first device 5 containing a SPAD pixel 10 and turn-off circuitry 15. The SPAD pixel 10 includes a SPAD 11, which may be a fully depleted three dimensional SPAD, having its cathode coupled to a high voltage HVSPAD (on the order of 20-25 V, for example 23 V) through a quench resistance Rq and having its anode coupled to ground through series connected n-channel transistors MN1 and MN2.

N-channel transistor MN1 is an extended-drain MOS capable of handling a drain to source voltage having a high voltage level (for example, on the order of 5 to 7 volts or higher). N-channel transistor MN1 has its drain directly electrically connected to the anode of the SPAD 11, its gate coupled to receive a cascode voltage VCAS, and its source directly electrically connected to the drain of n-channel transistor MN2.

N-channel transistor MN2 is also an extended-drain MOS capable of handling a drain to source voltage of 5 to 7 volts or higher. N-channel transistor MN2 has its drain directly electrically connected to the source of n-channel transistor MN1, its gate coupled to receive an enable voltage EN, and its source directly electrically connected to ground.

A capacitor Cc is coupled between the cathode of the SPAD 11 and a detection circuit formed by a CMOS inverter (series connected p-channel transistor MP2 and n-channel transistor MN3) coupled between a supply voltage VDD (e.g., 1.2 V) and ground, with a bias p-channel transistor MP1 coupled between the input of the CMOS inverter (gates of MP2 and MN3) and the supply voltage. The gate of transistor is coupled to receive a bias voltage VBIAS.

When it is desired for the SPAD 11 to be on and act as a SPAD (i.e., avalanche when struck by an incoming photon), the enable signal EN is asserted, turning on n-channel transistor MN2 to thereby couple the anode of the SPAD 11 to ground, setting the reverse bias of the SPAD 11 above its breakdown voltage, while clamp diode 12 disconnects the anode of the SPAD 11 from the VSPADOFF voltage (e.g., 7 V).

The capacitor Cc functions as an isolation capacitor, isolating the detection circuit from the cathode voltage. The node PSNODE is charged to the supply voltage VDD by the bias transistor MP1 being properly biased by the bias voltage BIAS.

Figure 4:
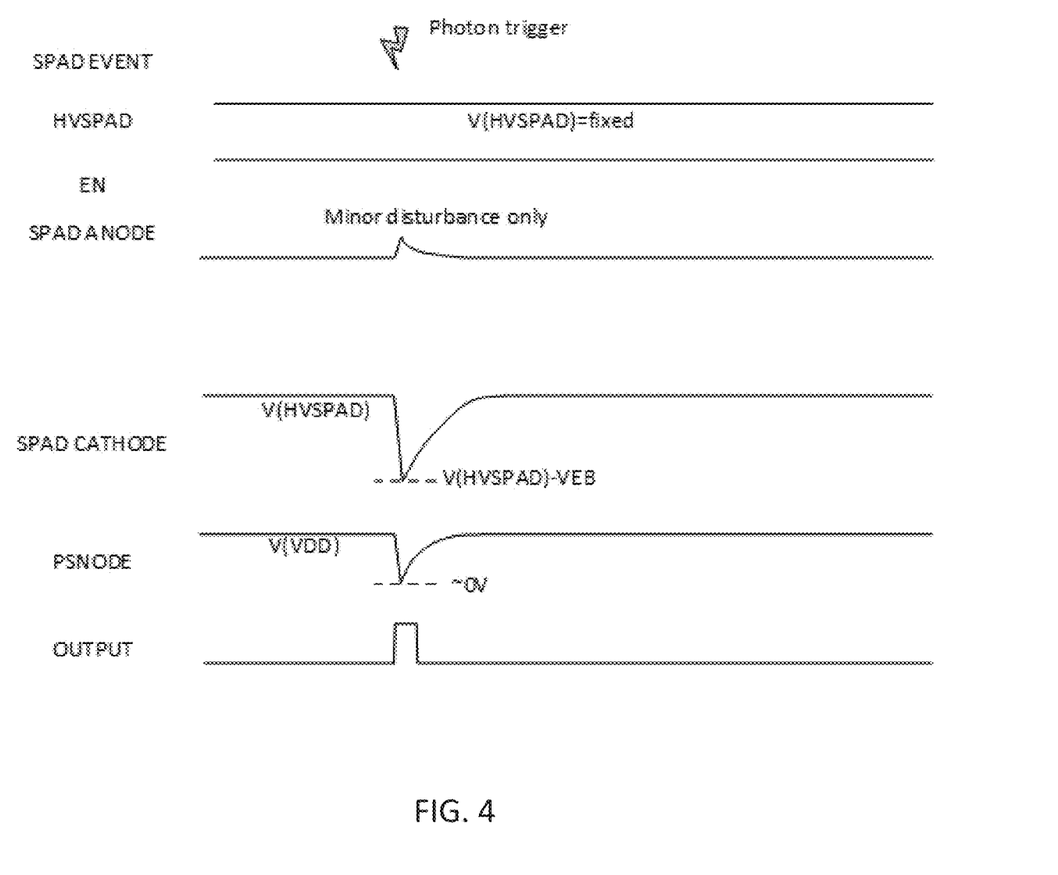
FIG. 4 is a schematic diagram of the second electronic device when enabled.

When an incoming photon strikes the SPAD 11, the SPAD 11 will avalanche, and its cathode voltage will swing between the high voltage and a lower voltage and then charge back up as the avalanche is quenched by the quench resistance Rq. This AC swing is coupled by the capacitor Cc onto the node PSNODE, and is inverted by the inverter formed by MP2 and MP3 to produce the output signal OUTPUT, such as shown in the timing diagram of FIG. 4.

For the case where it is desired for the SPAD 11 to be off, the turn-off circuitry 15 comes into play. The turn-off circuitry 15 includes a resistive divider formed by series connected resistances R1 and R2 connected between the cathode of the clamp diode 12 and ground. A charge pump 16 provides the voltage VSPADOFF to the cathode of the clamp diode 12. Input to the charge pump 16 is provided by amplifier 17, which has a non-inverting terminal coupled to receive a bandgap voltage VBG and an inverting terminal coupled to a tap node N1 between resistances R1 and R to receive a feedback voltage FBK. Note that the loop of the amplifier 17, charge pump 16, and feedback voltage FBK may be considered to be a regulation circuit.

To turn off the SPAD 11, the enable signal EN is released, turning off n-channel transistor MN2, allowing the anode of the SPAD 11 to float. VSPADOFF is pumped by the charge pump 16 to a voltage (e.g., 7 volts) such that VSPADOFF, along with diode 12, clamps the anode of the SPAD 11 to around VSPADOFF+Vt. Note that thermally or optically induced carriers within the SPAD 11 are relied upon in order for this voltage to be reached.

However, in high light conditions, even though the SPAD 11 is not biased to act as a SPAD (meaning that the control signal EN is such that transistor MN1 is off), the SPAD 11 nevertheless acts as a photodiode, and a photocurrent will be generated. The photocurrent flows from HVSPAD, through the SPAD 11 to the anode of the SPAD 11, to the anode of the clamp diode 12, which flows as reverse bias current through the clamp diode 12 to the resistive divider formed by resistances R1 and R2.

So that the current through the resistive divider formed by resistances R1 and R2 does not increase, which would increase VSPADOFF, based upon the output from the amplifier 17 (which compares the feedback signal FBK to the bandgap voltage VBG), the current output by the charge pump 16 is lowered so as to maintain the voltage VSPADOFF at a steady level.

Notice therefore that as the photocurrent increases, the current output by the charge pump 16 decreases. Thus, the maximum current provided by the charge pump 16 (drawn from the power supply voltage AVDD) occurs in low light conditions. Since the VSPADOFF voltage should be at a voltage much higher than the maximum supply to the chip, there is a need for it to be generated by a charge pump or boost converter. Although a charge pump can prove more economical than a booster converter, it expensive in terms of area, and consumes an undesirable amount of power. As an example, if AVDD is 3.3V, the current provided by the charge pump 16 to the resistors R1 and R2 is near 2 mA. As can be appreciated, as the number of SPAD pixels 10 included within the device 5 increases, the current consumption therefore increases and can become significant.

Thus, while the design of the device 5 is quite successful in enabling the use of fully depleted SPADs, yet further improvements may be made so as to reduce area and power consumption.

Figure 3:
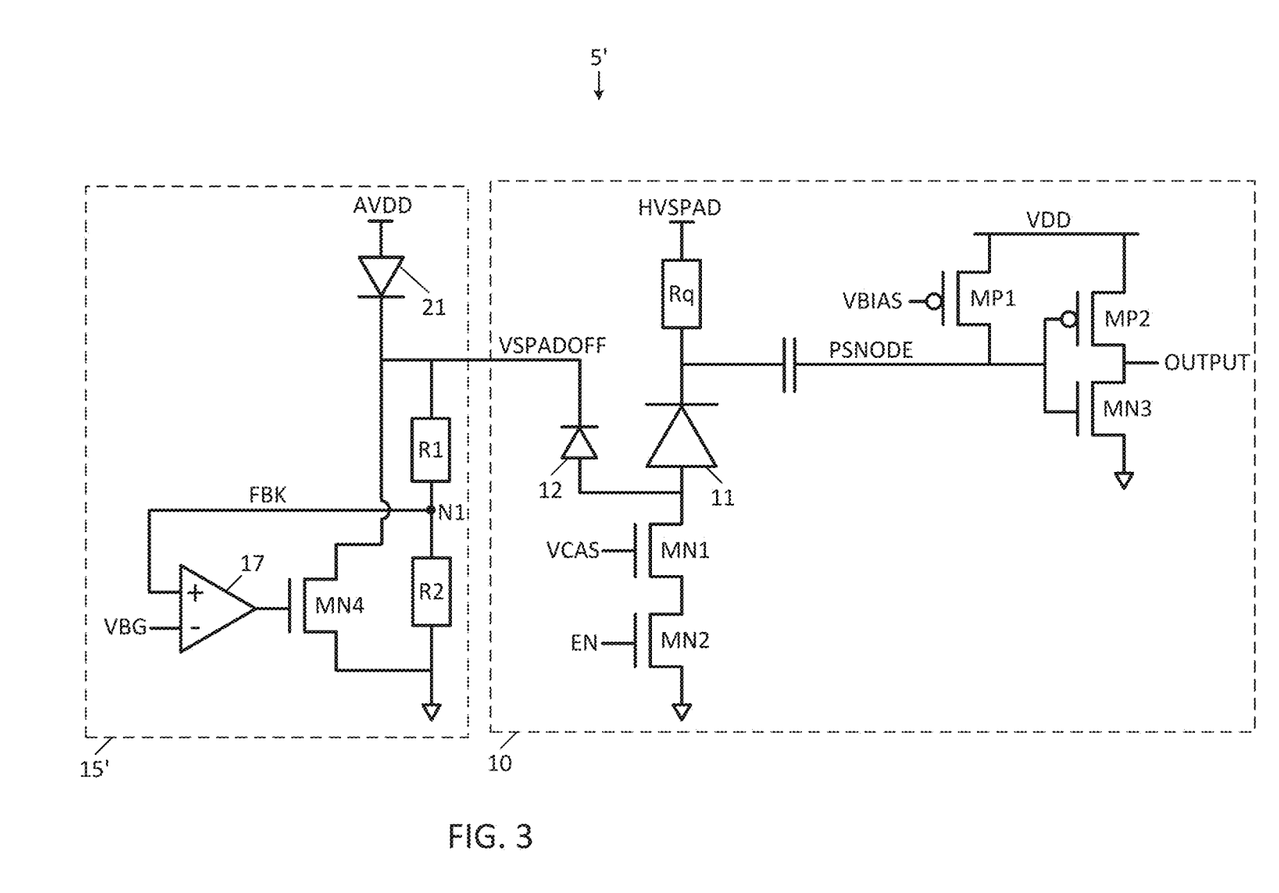
FIG. 3 is a schematic diagram of a second electronic device including a SPAD pixel and a turn-off circuit, as disclosed herein.

An improved device 5' is shown in FIG. 3. In this improved device 5', the SPAD pixel 10 remains the same, but the turn-off circuitry 15' is changed. In normal operation when the SPAD 11 is on (meaning that the enable signal EN is asserted to turn on n-channel transistor MN2, coupling the anode of the SPAD 11 to ground, while the clamp diode 12 disconnects the anode of the SPAD 11 from the VSPADOFF voltage), operation is as described above.

Namely, when an incoming photon strikes the SPAD 11, the SPAD 11 will avalanche, and its cathode voltage will swing between the high voltage and a lower voltage and then charge back up as the avalanche is quenched by the quench resistance Rq. This AC swing is coupled by the capacitor Cc onto the node PSNODE, and is inverted by the inverter formed by MP2 and MP3 to produce the output signal OUTPUT.

Operation of the improved device 5' to keep the SPAD 11 off will be described below, but first, the turn-off circuitry 15' will be described. The turn-off circuitry 15' includes a voltage divider formed by series connected resistances R1 and R2 that are coupled between the cathode of the clamp diode 12 and ground. The resistances R1 and R2 in the turn-off circuitry 15' are preferably higher in resistance value than that of the resistances of the turn-off circuitry 15 of the device 5 shown in FIG. 2.

An additional diode 21 has its anode coupled to the supply voltage AVDD and its cathode coupled to the cathode of the clamp diode 12. An n-channel transistor MN4 has its drain directly electrically connected to the cathode of the clamp diode 12 and its source directly electrically connected to ground.

An amplifier 17 has its inverting terminal coupled to a bandgap voltage VBG, its non-inverting terminal coupled to a tap node N1 between resistances R1 and R2 to receive a feedback signal FBK, and its output coupled to the gate of the n-channel transistor MN4.

Note that the n-channel transistor MN4 may be a drift MOS and capable of handling high voltage, or may be any other high-voltage transistor such as a high-voltage MOS or high-voltage BJT.

In operation, the amplifier 17, n-channel transistor MN4, and feedback signal FBK form a static feedback loop. When the SPAD 11 is off (meaning the enable signal EN is deasserted, turning off n-channel transistor MN2), in high light conditions, a photocurrent is generated by the SPAD 11 as explained above and flows from the anode of the SPAD 11, through the clamp diode 12 as a reverse current (since the clamp diode 12 is reverse biased), and into the resistances R1 and R2. In this case, when the feedback voltage FBK exceeds the bandgap voltage VBG, the amplifier 17 causes the n-channel transistor MN4 to sink some of the reverse current sufficient to maintain a constant current through the resistances R1 and R2, and maintain the voltage VSPADOFF at a constant level. Thus, in this configuration of the improved device 5', observe that it is not just the clamp diode 12 that sets the anode voltage of the SPAD 11 when the SPAD 11 is off, but it is also the photocurrent from the anode of the SPAD 11 that sets the anode voltage of the SPAD 11.

Note that the diode 21 may be omitted if desired, but when present, serves to pre-charge VSPADOFF and set VSPADOFF to be a minimum of VDD minus the threshold voltage.

In a sample operation case, the bandgap voltage VBG may be 1V (for example, in the case of a trimmed bandgap voltage), the supply voltage AVDD may be 3.3V, the voltage HVSPAD may be 20-25V, and VSPADOFF may be 7V. In this case, the resistance value of R1 is six times the resistance value of R2.

The device 5' described above has advantages over the device 5 in that it consumes less area and consumes less power, thereby increasing efficiency. The device 5' may be used in applications such as time-of-flight ranging (for example, direct time of flight ranging application for automotive and consumer usage), and light detection and ranging (LiDAR).

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method, comprising:
   using a charge pump to prevent a single photon avalanche diode (SPAD) from avalanching regardless of a value of a photocurrent generated by the SPAD by:
      sourcing a charge pump output current to a feedback divider to generate a turn-off voltage at a cathode of a clamp diode having its anode connected to an anode of the SPAD such that the turn-off voltage clamps the anode of the SPAD, and adjusting the charge pump output current inversely proportionally to the photocurrent generated by the SPAD.

2. A method, comprising:
using voltage regulation to prevent a single photon avalanche diode (SPAD) from avalanching regardless of a value of a photocurrent generated by the SPAD by:
sinking a turn-off current from a cathode of a clamp diode having its anode connected to anode of the SPAD, based upon a feedback voltage produced at a tap of a feedback divider connected between the cathode of clamp diode and ground, to generate a turn-off voltage at the cathode of the clamp diode that serves to clamp the anode of the SPAD;
wherein the sinking of the turn-off current is performed so that the turn-off current increases proportionally with the photocurrent generated by the SPAD.

3. The method of claim 2, wherein using the voltage regulation comprises causing the turn-off voltage at the anode of the SPAD to remain constant regardless of the value of the photocurrent.

4. A method, comprising:
causing a single photon avalanche diode (SPAD) to generate a photocurrent while not avalanching; and
sinking sufficient current from the SPAD to maintain the SPAD in a non-avalanchable condition regardless of a value of the photocurrent;
wherein sinking the sufficient current is performed by:
sinking a turn-off current from a cathode of a clamp diode having its anode connected to anode of the SPAD, based upon a feedback voltage produced at a tap of a feedback divider connected between the cathode of clamp diode and ground, to generate a turn-off voltage at the cathode of the clamp diode that serves to clamp the anode of the SPAD;
wherein the sinking of the turn-off current is performed so that the turn-off current increases proportionally with the photocurrent generated by the SPAD.

5. The method of claim 4, wherein maintaining the SPAD in the non-avalanchable condition is performed by sinking sufficient current from the SPAD to maintain the SPAD in the non-avalanchable condition by:
permitting the photocurrent to flow through a sense circuit coupled to the SPAD;
sinking a constant current from the sense circuit;
adjusting the constant current so that a turn-off voltage generated at the SPAD remains substantially constant regardless of the value of the photocurrent, with the turn-off voltage being sufficient to maintain the SPAD in the non-avalanchable condition.

6. The method of claim 5, wherein the photocurrent is permitted to flow from an anode of the SPAD through the sense circuit to ground.

7. A sensing pixel, comprising:
a single photon avalanche diode (SPAD) coupled between a first node and a second node;
a clamp diode coupled between a turn-off voltage node and the second node;
a turn-off circuit comprising:
a sense circuit configured to generate a feedback voltage based upon a voltage at the turn-off voltage node;
a semiconductor device configured such that it controls the voltage at the turn-off voltage node; and
an amplifier having a first input coupled to a reference voltage, a second input coupled to receive the feedback voltage, and an output coupled to a control terminal of the semiconductor device; and
a readout circuit coupled to the SPAD by a decoupling capacitor.

8. The sensing pixel of claim 7, wherein the readout circuit comprises:
a first transistor coupled between a supply voltage and the decoupling capacitor, and having a control terminal coupled to a bias voltage;
a second transistor coupled between the supply voltage and an output node, and having a control terminal coupled to a terminal of the first transistor; and
a third transistor coupled between the output node and ground, and having a control terminal coupled to the control terminal of the second transistor.

9. The sensing pixel of claim 7, wherein the SPAD has a cathode coupled to the first node and an anode coupled to the second node; wherein the clamp diode has a cathode coupled to the turn-off voltage node and an anode coupled to the second node; and wherein the readout circuit is coupled to the SPAD at the first node by the decoupling capacitor.

10. The sensing pixel of claim 9, further comprising: a quench element coupled between a high voltage node and the first node; and an enable circuit coupled between the second node and ground.

11. The sensing pixel of claim 10, wherein the enable circuit comprises: a cascode transistor having a drain coupled to the second node, a gate coupled to a cascode control voltage, and a source; and an enable transistor having a drain coupled to the source of the cascode transistor, a source coupled to ground, and a gate coupled to an enable voltage.

12. The sensing pixel of claim 7, wherein the first input of the amplifier is a non-inverting input; and wherein the second input of the amplifier is an inverting input.

13. The sensing pixel of claim 7, wherein the turn-off circuit further comprises a resistive divider coupled between the turn-off voltage node and ground, with the feedback voltage being generated at a tap node of the resistive divider.

14. The sensing pixel of claim 7, wherein the SPAD is a fully depleted SPAD formed using a three dimensional layout.

15. A sensing pixel, comprising:
a single photon avalanche diode (SPAD) having a cathode coupled to a high voltage node through a quench element, and an anode selectively coupled to ground;
a clamp diode having an anode coupled to the anode of the SPAD and a cathode coupled to a turn-off voltage node; and
a turn-off circuit comprising:
an additional diode having an anode coupled to a supply voltage and a cathode coupled to the turn-off voltage node;
a sense circuit configured to generate a feedback voltage based upon a voltage at the turn-off voltage node;
a semiconductor device configured such that it controls a voltage at the turn-off voltage node; and
an amplifier having an inverting input coupled to a reference voltage and a non-inverting input coupled to receive the feedback voltage, the amplifier having an output coupled to a control terminal of the semiconductor device;
wherein when the SPAD has its anode disconnected from ground and is exposed to light, the SPAD generates a photocurrent that flows from the anode of the SPAD, through the clamp diode to the turn-off voltage node, and through the sense circuit; and
wherein the output of the amplifier adjusts output of the semiconductor device to adjust the voltage at the turn-off voltage node.

16. The sensing pixel of claim 15, wherein the sense circuit comprises a resistive divider coupled between the turn-off voltage node and ground, with the feedback voltage being generated at a tap node of the resistive divider.

17. The sensing pixel of claim 16, wherein the resistive divider comprises: a first resistor connected between the turn-off voltage node and the tap node; and a second resistor connected between the tap node and ground.

18. The sensing pixel of claim 15, wherein the SPAD is a fully depleted SPAD formed using a three dimensional layout.

19. The sensing pixel of claim 15, further comprising a readout circuit coupled to the cathode of the SPAD, the readout circuit including an inverter generating an output signal based upon a voltage at the cathode of the SPAD.

* * * * *